US009297645B2

(12) United States Patent
Schönleber (10) Patent No.: US 9,297,645 B2
(45) Date of Patent: Mar. 29, 2016

(54) APPARATUS AND METHOD FOR DETERMINING A DEPTH OF A REGION HAVING A HIGH ASPECT RATIO THAT PROTRUDES INTO A SURFACE OF A SEMICONDUCTOR WAFER (75) Inventor: Martin Schönleber, Aschaffenburg (DE)

(73) Assignee: Precitec Optronik Gmbh (DE)

( * ) Notice: Subject to any disclaimer, the term of this patent is extended or adjusted under 35 U.S.C. 154(b) by 0 days.

(21) Appl. No.: 13/440,434

(22) Filed: Apr. 5, 2012

(65) Prior Publication Data
US 2012/0257213 A1 Oct. 11, 2012

(30) Foreign Application Priority Data

Apr. 6, 2011 (GB) .................................. 1105819.5

(51) Int. Cl.
G01B 11/02 (2006.01)
G01B 11/22 (2006.01)
G01B 9/02 (2006.01)
H01L 21/66 (2006.01)
(52) U.S. Cl.
CPC ............ *G01B 11/22* (2013.01); *G01B 9/02044* (2013.01); *G01B 9/02084* (2013.01); *G01B 9/02091* (2013.01); *H01L 22/12* (2013.01); *G01B 2210/56* (2013.01)
(58) Field of Classification Search
CPC ............... G01B 11/22; G01B 9/02044; G01B 9/02084; G01B 9/02091; H01L 22/12
USPC .......... 356/503–504, 492–493, 485–486, 516
See application file for complete search history.

(56) References Cited

U.S. PATENT DOCUMENTS

| 4,861,131 A | 8/1989 | Bois et al. |
| 5,276,631 A | 1/1994 | Popovic et al. |
| 5,392,124 A | 2/1995 | Barbee et al. |
| 5,532,815 A | 7/1996 | Kipman et al. |
| 5,691,540 A | 11/1997 | Halle et al. |

(Continued)

FOREIGN PATENT DOCUMENTS

| CN | 101393015 | 3/2009 |
| DE | 19525770 | 8/1996 |

(Continued)

OTHER PUBLICATIONS

Malta, D. et al.; "Fabrication of TSV-Based Silicon Interposers", RTI International, 6 pgs.

(Continued)

*Primary Examiner* — Michael A Lyons
*Assistant Examiner* — Dominic J Bologna
(74) *Attorney, Agent, or Firm* — Taylor English Duma LLP (57) ABSTRACT An apparatus and method for determining a depth of a region having a high aspect ratio that protrudes into a surface of a semiconductor wafer are provided. The apparatus comprises a multi-wavelength light source, a semiconductor wafer holder for holding a semiconductor wafer, a head for directing the light source onto the semiconductor wafer, a spectrometer for collecting light comprising multiple wavelengths reflected from the semiconductor wafer and analysis means for determining a depth of the region from an interference pattern of light reflected from the semiconductor wafer by performing Fourier domain optical coherence tomography.

26 Claims, 5 Drawing Sheets

(56) References Cited

U.S. PATENT DOCUMENTS

| | | | |
|---|---|---|---|
| 5,905,572 | A | 5/1999 | Li |
| 6,099,522 | A | 8/2000 | Knopp et al. |
| 6,396,069 | B1 | 5/2002 | MacPherson et al. |
| 6,672,943 | B2 | 1/2004 | Vogtmann et al. |
| 6,673,654 | B2 | 1/2004 | Ohno et al. |
| 6,686,270 | B1 | 2/2004 | Subramanian et al. |
| 6,768,552 | B2 * | 7/2004 | Takahashi et al. ............ 356/479 |
| 6,806,969 | B2 | 10/2004 | Clifford, Jr. et al. |
| 6,887,126 | B2 | 5/2005 | Brouillette et al. |
| 6,897,964 | B2 | 5/2005 | Takahashi et al. |
| 7,271,916 | B2 | 9/2007 | Jasapara et al. |
| 7,306,696 | B2 | 12/2007 | Lian et al. |
| 7,307,735 | B2 | 12/2007 | Hecht et al. |
| 7,477,401 | B2 | 1/2009 | Marx et al. |
| 7,525,732 | B2 | 4/2009 | Uehara et al. |
| 7,652,774 | B2 | 1/2010 | Lian et al. |
| 7,705,995 | B1 | 4/2010 | Johs et al. |
| 7,738,113 | B1 | 6/2010 | Marx et al. |
| 8,716,039 | B2 | 5/2014 | Dusemund |
| 8,982,339 | B2 | 3/2015 | Schonleber et al. |
| 2002/0153500 | A1 | 10/2002 | Fordahl et al. |
| 2003/0016353 | A1 | 1/2003 | Detalle et al. |
| 2003/0090671 | A1 | 5/2003 | Takahashi et al. |
| 2004/0021874 | A1 | 2/2004 | Shimmick |
| 2004/0185582 | A1 | 9/2004 | Kueny |
| 2004/0262529 | A1 | 12/2004 | Yoshida et al. |
| 2005/0003642 | A1 * | 1/2005 | Hecht et al. ............... 438/526 |
| 2005/0140981 | A1 | 6/2005 | Waelti |
| 2005/0237537 | A1 * | 10/2005 | Leizerson et al. ............ 356/504 |
| 2005/0248771 | A1 | 11/2005 | Eussen et al. |
| 2006/0194419 | A1 | 8/2006 | Araki |
| 2007/0046948 | A1 | 3/2007 | Podoleanu et al. |
| 2007/0086018 | A1 * | 4/2007 | Shih et al. ............... 356/498 |
| 2007/0148792 | A1 * | 6/2007 | Marx et al. ............... 438/14 |
| 2007/0188765 | A1 * | 8/2007 | Zhao et al. ............... 356/479 |
| 2007/0231717 | A1 | 10/2007 | Rivers et al. |
| 2007/0258095 | A1 * | 11/2007 | Olivier et al. ............... 356/479 |
| 2008/0013078 | A1 | 1/2008 | Podoleanu et al. |
| 2008/0151237 | A1 | 6/2008 | Lian et al. |
| 2009/0031792 | A1 * | 2/2009 | Fan et al. ............... 73/105 |
| 2009/0059239 | A1 | 3/2009 | Hoffmann et al. |
| 2009/0250635 | A1 | 10/2009 | Sykora et al. |
| 2009/0257065 | A1 | 10/2009 | Hauger et al. |
| 2009/0273782 | A1 | 11/2009 | Yoo et al. |
| 2010/0007894 | A1 | 1/2010 | Suehira |
| 2010/0051068 | A1 | 3/2010 | Miyanari |
| 2010/0110376 | A1 * | 5/2010 | Everett et al. ............... 351/206 |
| 2010/0265493 | A1 * | 10/2010 | Jiang et al. ............... 356/51 |
| 2010/0283842 | A1 | 11/2010 | Guissin et al. |
| 2010/0321671 | A1 * | 12/2010 | Marx et al. ............... 356/51 |
| 2011/0085136 | A1 | 4/2011 | Ferguson et al. |
| 2011/0180521 | A1 | 7/2011 | Quitter et al. |
| 2011/0222070 | A1 | 9/2011 | Nagai et al. |
| 2011/0292375 | A1 | 12/2011 | Marx et al. |
| 2012/0050723 | A1 | 3/2012 | Emtman et al. |
| 2012/0238869 | A1 | 9/2012 | Schmitt et al. |
| 2012/0257207 | A1 | 10/2012 | Marx et al. |
| 2013/0034918 | A1 | 2/2013 | Dusemund et al. |

FOREIGN PATENT DOCUMENTS

| | | |
|---|---|---|
| DE | 69622943 | 3/2003 |
| DE | 10319843 | 4/2004 |
| DE | 102004011189 | 9/2005 |
| DE | 102004052205 | 5/2006 |
| DE | 102005036719 | 2/2007 |
| DE | 102005052743 | 5/2007 |
| DE | 102008041062 | 4/2009 |
| DE | 102010000079 | 1/2010 |
| DE | 102008049821 | 4/2010 |
| DE | 102010016862 | 5/2010 |
| DE | 102010015944 | 7/2011 |
| DE | 102011081596 | 4/2012 |
| DE | 102011051146 | 10/2012 |
| DE | 102011055735 | 5/2013 |
| DE | 102012111008 | 5/2014 |
| EP | 0905476 | 3/1999 |
| EP | 1018632 | 7/2000 |
| EP | 1977850 | 10/2008 |
| EP | 2159535 | 3/2010 |
| FR | 2950441 | 3/2011 |
| GB | 1105819 | 3/1968 |
| JP | 6065963 | 4/1988 |
| KR | 1020080112436 | 12/2008 |
| TW | 200712585 | 4/2007 |
| TW | 200937005 | 9/2009 |
| WO | 9727613 | 7/1997 |
| WO | 2006028926 | 3/2006 |
| WO | 2007060441 | 5/2007 |
| WO | 2008010996 | 1/2008 |
| WO | 2011086490 | 7/2011 |
| WO | 2011141867 | 11/2011 |
| WO | 2014076649 | 5/2014 |

OTHER PUBLICATIONS

Knuttel, Dr. Alexander; "Non-compact Roughness and 3D Topography Evaluation of grinded Wafers down to nm level", Dec. 1, 2010, 25 pgs.

Jakob, Dr. G., "Koaxiale Interferometrische Schichtdickenmessung", Optical Measuring, Sonderdruck aus Photonik Mar. 2000; 4 pgs.

ISIS Sentronics Gmbh Data Sheet, "StraDex a3 sensor"; 3 pgs.

Schonleber; United Kingdom Search Report for serial No. GB1105819.5, filed Apr. 6, 2011, mailed Jul. 23, 2012, 4 pgs.

Schoenleber; German Examination Report for serial No. DE102012102826, mailed Sep. 28, 2012, 14 pgs.

Dusemund, Claus; Issue Notification for U.S. Appl. no. 13/521,736, filed Jul. 11, 2012, mailed Apr. 16, 2014, 1 pg.

Dusemund, Claus; Non-Final Office Action for U.S. Appl. No. 13/521,736, filed Jul. 11, 2012, mailed Jul. 23, 2013, 18 pgs.

Dusemund, Claus; Notice of Allowance for U.S. Appl. No. 13/521,736, filed Jul. 11, 2012, mailed 12/2712013, 8 pgs.

Dusemund; International Preliminary Report on Patentability for serial no. PCT/IB2011/050091, filed Jan. 10, 2011, mailed Aug. 16, 2012, 14 pgs.

Dusemund; International Search Report and Written Opinion for serial no. PCT/IB2011/050091, filed Jan. 10, 2011, mailed Apr. 12, 2011, 3 pgs.

Huang et al.; "Optical coherence tomography", Science, vol. 254, No. 5035, S. 1178-1181 (1991).

Vakhtin et al.; "Common-path interferometer for frequency-domain optical coherence tomography"; Applied Optics, vol. 42, No. 34, S. 6953-6957 (2003).

Extended European Search Report for serial no. EP12172165, mailed Oct. 24, 2012, 5 pgs.

Precitec Optronik GMBH; Korean Notice of Preliminary Rejection for serial no. 10-2012-0064923, filed Jun. 18, 2012, mailed Oct. 30, 2014, 11 pgs.

Schonleber, Martin; Final Office Action for U.S. Appl. No. 13/525,184, filed Jun. 15, 2012, mailed Oct. 7, 2014, 17 pgs.

Schonleber, Martin; Non-Final Office Action for U.S. Appl. No. 13/525,184, filed Jun. 15, 2012, mailed Feb. 25, 2014, 16 pgs.

Schonleber, Martin; Non-Final Office Action for U.S. Appl. No. 13/525,184, filed Jun. 15, 2012, mailed Feb. 19, 2015, 21 pgs.

Schonleber; German Examination Report for serial no. DE102011051146, filed Oct. 4, 2012, mailed Jan. 19, 2012, 6 pgs.

Schonleber; U.S. Patent Application entitled: Test Device and Bonding Layer Between Wafer-Shaped Samples and Test Process for Testing the Bonding Layer, having U.S. Appl. No. 13/525,184. filed Jun. 15, 2012, 23 pgs.

Schonleber, Martin; Final Office Action for U.S. Appl. No. 13/667,809, filed Nov. 2, 2012, mailed Sep. 16, 2013, 9 pgs.

Schonleber, Martin; Issue Notification for U.S. Appl. No. 13/667,809, filed Nov. 2, 2012, mailed Feb. 25, 2015, 1 pg.

Schonleber, Martin; Non-Final Office Action for U.S. Appl. No. 13/667,809, filed Nov. 2, 2012, mailed Apr. 15, 2013; 12 pgs.

(56) References Cited

OTHER PUBLICATIONS

Schonleber, Martin; Non-Final Office Action for U.S. Appl. No. 13/667,809, filed Nov. 2, 2012, mailed Apr. 24, 2014; 8 pgs.
Schonleber, Martin; Notice of Allowance for U.S. Appl. No. 13/667,809, filed Nov. 2, 2012, mailed Dec. 4, 2014, 10 pgs.
Schonleber, Martin; U.S. Patent Application entitled: Material-Working Device with In-situ Measurement of the Working Distance, having U.S. Appl. No. 13/667,809, filed Nov. 2, 2012, 32 pgs.
Schonleber; International Preliminary Report on Patentability for serial No. PCT/IB2011/052048 filed May 10, 2011, mailed Nov. 22, 2012, 7 pgs.
Schonleber; International Search Report and Written Opinion for serial No. PCT/IB2011/052048 filed May 10, 2011, mailed Sep. 21, 2011, 2 pgs.
Michelt, Berthold; U.S. Patent Application entitled: Optical Measuring Device for Acquiring Differences in Distance and Optical Measuring Method, having U.S. Appl. No. 14/307,481, filed Jun. 17, 2014, 37 pgs.
Precitec Optronic Gmbh; International Search Report and Written Opinion for serial No. PCT/IB2014/062290, filed Jun. 17, 2014, mailed Sep. 22, 2014, 20 pgs.
Schonleber, Martin; International Search Report and Written Opinion for PCT/IB2013/060127, filed Nov. 14, 2013, mailed Mar. 21, 2014, 10 pgs.
Schonleber, Martin; U.S. Patent Application entitled: Optical Measuring Method and Measuring Device Having a Measuring Head for Capturing a Surface Topography by Calibrating the Orientation of the Measuring Head, having U.S. Appl. No. 14/713,150, filed May 15m 2015, 54 pgs.
German Examination Report for German Application No. DE102013010030.5, filed Jun. 17, 2013, mailed Feb. 28, 2014, 12 pgs.
Niklaus, et al. "Adhesive Wafer Bonding", Journal of Applied Physics, Applied Physics Reviews—Focused Review, 2006, vol. 99, No. 1, pp. 031101.1-031101.28.
Rowland, et al. "Impact of polymer film thickness and cavity size on polymer flow during embossing: toward process design rules for nanoimprint lithography", Journal of Micromechanics and Microengineering, 2005, vol. 15, pp. 2414-2425.
Taiwan Office Action for serial no. 101121622, filed Jun. 15, 2012, mailed May 21, 2014, 15 pgs.
Schonleber, Martin; Final Office Action for US. Appl. No. 13/525,184, filed Jun. 15, 2012, mailed Jul. 28, 2015, 32 pgs.
Michelt, Berthold; Non-Final Office Action for U.S. Appl. No. 14/307,481, filed Jun. 17, 2014, mailed Aug. 26, 2015, 41 pgs.
German Examination Report for serial No. 102012111008.5, filed Nov. 15, 2012, mailed Jun. 19, 2013, 17 pgs.
Schonleber, Martin; Applicant Interview Summary for U.S. Appl. No. 13/525,184, filed Jun. 15, 2012, mailed Oct. 27, 2015, 3 pgs.
Michelt, Berthold; Applicant Interview Summary for U.S. Appl. No. 14/307,481, filed Jun. 17, 2014, mailed Nov. 20, 2015, 3 pgs.
Precitec Optronik GMBH; French Preliminary Search Report and Written Opinion for serial No. FR1253225, mailed Nov. 13, 2013, 10 pgs.
Schonleber, Martin; Non-Final Office Action for U.S. Appl. No. 13/525,184, tiled Jun. 15, 2012, mailed Dec. 31, 2015, 21 pgs.

\* cited by examiner

APPARATUS AND METHOD FOR DETERMINING A DEPTH OF A REGION HAVING A HIGH ASPECT RATIO THAT PROTRUDES INTO A SURFACE OF A SEMICONDUCTOR WAFER

CROSS-REFERENCE TO RELATED APPLICATION

In accord with 35 U.S.C. §119, this application claims the benefit of United Kingdom Patent Application serial number GB1105819.5, filed Apr. 6, 2011, which is hereby incorporated herein by reference in its entirety.

FIELD

The invention relates to apparatus and method for determining a depth of a region having a high aspect ratio that protrudes into a surface of a semiconductor wafer. Such a region may be a trench or a via, for example.

BACKGROUND

U.S. Pat. No. 7,738,113 discloses a wafer measurement system and apparatus for the measurement of wafer thickness, flatness and trench depth. The back surface of the wafer is used to accurately measure the backside of a trench, thus rendering the trench an effective bump that is capable of being measured on the top surface and the bottom surface through a non-contact optical instrument.

Increasing miniaturisation of semiconductor devices tends to lead to the miniaturisation of the features within the devices including features such as trenches and vias. Features such as trenches and vias have a high aspect ratio. With increasing miniaturisation, in particular, with increasing lateral shrink, the aspect ratio of these features may also increase. However, an increase in the aspect ratio further increases the difficulty of measuring the depth of the feature. Therefore, further developments in apparatus and methods are desirable in order to be able to better determine the depth of features having a high aspect ratio.

SUMMARY

A method of measuring a depth of a region having a high aspect ratio that protrudes into a surface of a semiconductor wafer is provided which comprises providing a semiconductor wafer having a first major surface and a second major surface opposing the first major surface. The semiconductor wafer comprises at least one region that protrudes into the first major surface and has a width and a depth and a high aspect ratio. At least one of the first major surface and the second major surface of the semiconductor wafer is illuminated with light comprising multiple wavelengths. Light of multiple wavelengths is reflected by the semiconductor wafer and this reflected light of multiple wavelengths is measured as a function of wavelength. The light reflected by the semiconductor wafer forms an interference pattern which is analysed by applying a Fourier transform to the interference pattern and generating a graphical representation having peaks associated with different interfaces of the semiconductor wafer. The depth of the region is determined from at least one of the peaks.

DETAILED DESCRIPTION

As used herein, a region that protrudes into the first major surface is used to denote a region positioned in a plane below a surface plane of the semiconductor wafer. The region may be a depression or recess positioned in the first major surface of the semiconductor wafer. Region is also used to cover a through-hole which extends throughout the thickness of the semiconductor wafer and is open at both ends. The depression or recess or through-hole has a high aspect ratio.

As used herein, high aspect ratio is defined as a region having a ratio of a width to a depth of at least 1 to 10 and, in a further embodiment, of at least 1 to 50.

The region may be a trench or a via. A trench is a term used in semiconductor technology to denote an elongated longitudinal recess having a base which may be rounded. In semiconductor technology, a via may be used to denote either a hole which extends throughout the thickness of the semiconductor wafer and is open at two ends or a via may be a closed end opening. In contrast to a trench, the planar cross-section of a via is non-elongate. A via typically has a circular planar cross-section but may also be square or hexagonal, for example. The trench or the via has a high aspect ratio. A via is also referred to as a TSV or Through Silicon Via.

The method comprises analysing the light reflected by the semiconductor wafer which forms an interference pattern by applying a Fourier transform to the interference pattern and generating a graphical representation having peaks associated with the different interfaces of the wafer. This method has the advantage that the optical position of the peaks can be more accurately determined and, therefore, that the optical and the geometrical depth of the region can be more accurately determined than by using methods which do not analyse an interference pattern by applying a Fourier transform. Additionally, depending on the number of interfaces of semiconductor wafer, the depth of the high aspect ratio region may be determined from the difference of the distances, i.e. the distance between two peaks in the graphical representation.

The method uses Fourier Domain optical coherence tomography (OCT) which is also referred to as Fourier Transform optical coherence tomography and spectral domain optical coherence tomography to produce a graphical representation including at least one peak. The graphical representation has the same form as that produced by time domain optical coherence tomography. However, in time domain optical coherence tomography the graphical representation is measured sequentially and a Fourier transform is not used.

In one embodiment, the intensity of the light of multiple wavelengths that is reflected by the semiconductor wafer is measured as a function of the inverse of the wavelength.

In an embodiment, the intensity of the light of multiple wavelengths that is reflected by the semiconductor wafer is measured using a detector having a plurality of pixels. The wavelength of the light collected by each pixel λ(p) may be determined using a spectrometer for example. The intensity of each wavelength for each pixel is mapped to provide intensity as a function of k where $k=2\pi/\lambda(p)$ with equidistant k using a fast fourier transform. This method may be used to yield a graphical representation of intensity as a function of the inverse of the wavelength or as a function of optical thickness which has one or more peaks.

For 512 pixels a 1024 point fast fourier transform (FFT) may be applied. The measured area $z_1$ is given as $$z_1 = 0.5 \Big/ \left( \frac{1}{\lambda_1} - \frac{1}{\lambda_2} \right)$$

$\lambda_1$ is minimum wavelength and $\lambda_2$ is the maximum wavelength.

The at least one peak in the graphical representation may correspond to an optical thickness of a layer defined by two interfaces of the semiconductor wafer. For example, the layer could be defined by the interface between the environment and the first major surface and the interface defined by the second major surface and the environment. Alternatively, the layer could be defined by the interface between the base of the region and the environment and interface between the second major surface and the environment.

The geometrical depth of the region may be determined by dividing the optical depth of the region by the refractive index of the layer, for example, the refractive index of the material of the semiconductor wafer.

The graphical representation may also comprise the intensity of the Fourier transformed interference pattern as a function of optical depth. In this case, the optical depth of the high aspect ratio region may be determined by the difference of the distances between peaks in the graphical representation or by the absolute position of a peak in the graphical representation.

In a further embodiment, at least one of the first major surface and the second major surface is illuminated with light comprising multiple wavelengths at two or more positions. In one embodiment, the semiconductor wafer is moved relative to the light illuminating the semiconductor wafer and the light reflected by the semiconductor wafer is measured at at least one further position.

This embodiment may be used to measure the depth of a second separate object, for example a second via, or the depth of same object, for example a trench, in a different position of this object. In a further embodiment, the semiconductor wafer is moved in two perpendicular directions relative to the light illuminating the semiconductor wafer and the reflected light is analysed so as to produce a three-dimensional map of the semiconductor wafer. In a Cartesian coordinate system, if the light impinges the semiconductor wafer in the z direction, the wafer may be moved in the x and y dimensions.

The light of multiple wavelengths may have a wavelength range of 440 nm to 500 nm or of 350 nm to 410 nm. These wavelength ranges denote blue or ultraviolet light, respectively. The bandwidth of the light source may be 25 to 30 nm.

The semiconductor wafer may be illuminated with light comprising multiple wavelengths that is emitted from one of the group consisting of a light emitting diode (LED), an electric or laser driven Xenon lamp, a super continuum provided by a single fibre source, a super luminescent diode (SLD) and a swept source super luminescent diode (SLD).

If an LED is used as the light source, it may emit light at a wavelength of 450 nm±30 nm, 470 nm±30 nm or 380±30 nm if the light is to illuminate the surface of the wafer including the region whose depth is to be measured.

In other embodiments, the light illuminating the wafer impinges the rear side of the wafer. In these embodiments, infra red light is used.

In a further embodiment, the light of multiple wavelengths is passed through an optical beam splitter before impinging the semiconductor wafer. The optical beam splitter may have an input arm, an output arm and a measuring arm. The output arm, input arm and the measuring arm may be provided by optical fibres. In the case of optical fibres, the optical beam splitter is a phase coupler.

The light of multiple wavelengths may be passed through the input arm and the measuring arm of the optical beam splitter before impinging on to the semiconductor wafer. The light reflected from the semiconductor wafer may be directed through the measuring arm and output arm of the optical beam splitter. The reflected light may be directed into a spectrometer that is coupled to the output arm of the optical beam splitter.

The spectrometer is used to collect the reflected light. The spectrometer includes a plurality of pixels, each of which is assigned to collect light of a certain predetermined wavelength. The spectrometer may include 512 pixels for example. The spectrometer may also further include means for applying the Fourier transform to the interference pattern formed by the reflected light and generate a graphical representation. The processing capability required to apply the Fourier transform and generate the graphical representation may be provided by an additional computer coupled to the spectrometer.

The invention also provides apparatus for determining the depth of a high aspect ratio region protruding into the surface of the semiconductor wafer. The apparatus comprises a multi-wavelength light source, a head for directing the multi-wavelength light source onto the semiconductor wafer, a spectrometer for collecting light comprising multiple wavelengths that is reflected from the Semiconductor wafer, and analysis means for determining the depth of a region from an interference pattern of light reflected from semiconductor wafer by performing Fourier domain optical coherence tomography. The analysis means may be a suitably programmed computer, for example.

The multi-wavelength light source may be a light emitting diode, a superluminescent diode, a swept source super luminescent diode, an electric or laser driven Xenon lamp or a super continuum provided by a single fibre source. The multi-wavelength light may have a wavelength range of 440 nm to 500 nm or of 350 nm to 410 nm.

The apparatus comprises a semiconductor wafer holder to hold the semiconductor wafer in position whilst it is analysed. The semiconductor wafer holder may comprise a simple mechanical clamp or may comprise a vacuum chuck.

The head for directing the light source onto the semiconductor wafer may be positioned adjacent the front side of a semiconductor wafer holder for holding the semiconductor wafer or adjacent the rear side of a semiconductor wafer holder for holding the semiconductor wafer.

The apparatus may further comprise an optical beam splitter comprising an input arm coupled to the light source, an output arm coupled to the spectrometer and a measuring arm coupled to the head. Light may be passed through the measuring arm to illuminate the semiconductor wafer and light reflected from semiconductor wafer can also be collected by the measuring arm and be directed via the output arm to the spectrometer.

In order to allow mapping of the depth of features protruding into the surface of the semiconductor wafer, the semiconductor wafer holder may be movable in at least one direction perpendicular to the head or in two directions perpendicular to the head. Alternatively, or in addition, the head may be movable in at least one direction parallel to the semiconductor wafer holder. The head may also be movable in a direction perpendicular to the semiconductor wafer holder and, therefore, perpendicular to a semiconductor wafer held by the semiconductor wafer holder.

The invention also relates to the use of Fourier domain optical coherence tomography to determine the depth of at least one region in the surface of the semiconductor wafer, whereby the region can be a trench, an open-ended via or a closed end via protruding into a surface of semiconductor wafer such as a silicon wafer.

Figure 1:
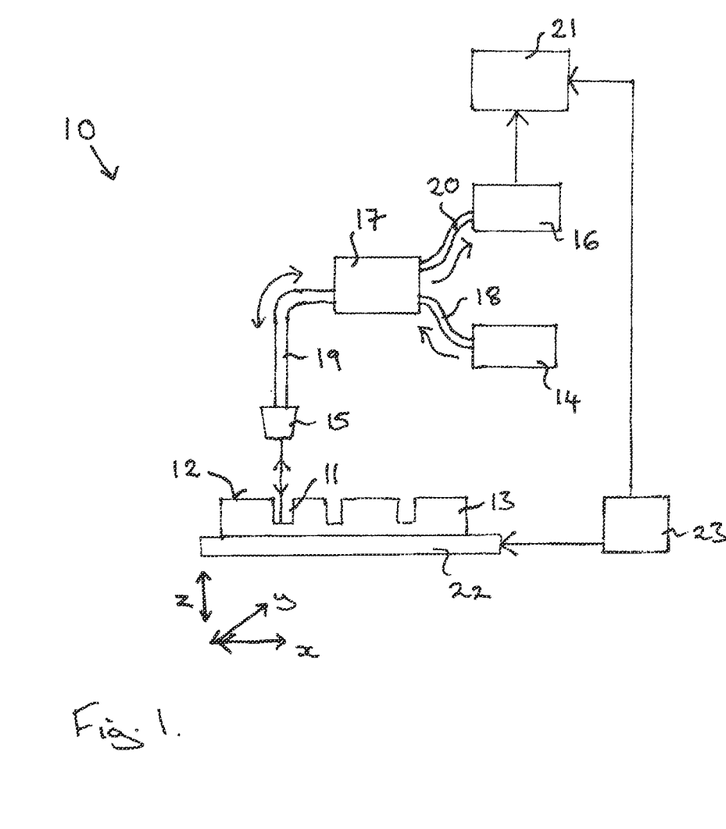
FIG. 1 illustrates apparatus for determining the depth of a region protruding into a surface of a semiconductor wafer.

FIG. 1 illustrates apparatus 10 for determining the depth of a region 11 having a high aspect ratio in a surface 12 of a semiconductor wafer 13.

The apparatus 10 comprises a light source 14 producing light of multiple wavelengths, a head 15 for directing the light source onto the semiconductor wafer 13, a spectrometer 16 for collecting light of multiple wavelengths that is reflected from the surface 12 of the semiconductor wafer 13 and analysis means 21 for determining a depth of the region 11 from an interference pattern of light reflected from the semiconductor wafer 13 by performing Fourier domain optical coherence tomography.

An optical beam splitter 17 is provided that has an input arm 18 coupling the light source 14 to the optical beam splitter, a measuring arm 19 that is used to direct the light from the light source 14 to the head 15 and onto the semiconductor wafer 13. The head 15 and measuring arm 19 are also used to collect the light that is reflected from the surface 12 of the semiconductor wafer 13 which is then directed through the optical beam splitter 17 via the output arm 20 to the spectrometer 16. In this embodiment, the input arm 18, the measuring arm 19 and the output arm 20 are optical fibres and the optical beam splitter is a phase coupler.

The light source 14 produces light of multiple wavelengths having a bandwidth in the blue or ultraviolet range. The light source is, in this embodiment, provided by a Xenon lamp. However, a light emitting diode or a super continuum provided by a single fibre source may also be used.

The analysis means 21 comprises a suitably programmed processor may be provided in the form of a computer, for example. The analysis means 21 is programmed to apply a Fourier transform to the interference pattern collected by the spectrometer 16 and to produce a graphical representation which includes at least one peak.

The semiconductor wafer 13 is positioned on a semiconductor wafer holder 22 which is movable in two directions, denoted as the x, y directions in FIG. 1, perpendicular to the head 15 and perpendicular to the light, denoted as the z direction in FIG. 1, illuminating the surface 12 of the semiconductor wafer 13.

The semiconductor wafer holder also comprises a mechanism 23 for changing the position of the semiconductor wafer holder 21 which is coupled to the analysis means 21 so that the position of the semiconductor wafer 13 is known to the analysis means 21 for each generated interference pattern. In this way, the position of the semiconductor wafer 13 can be coordinated with the analysis of the surface of the semiconductor wafer 13 to allow three-dimensional map of the surface 12 semiconductor wafer 13 to be generated.

Figure 2A:
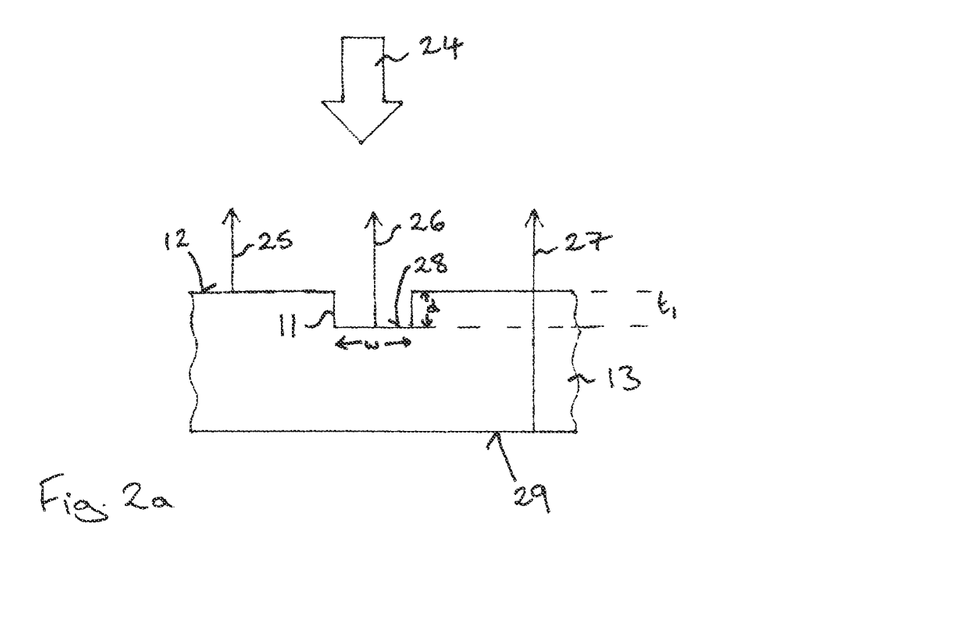
FIGS. 2a and 2b illustrate schematic diagrams of light of multiple wavelengths illuminating a surface of a semiconductor wafer and being reflected therefrom.

FIG. 2a illustrates a more detailed view of the region 11 having a high aspect ratio which protrudes into the first surface 12 into the body of the semiconductor wafer 13. In this embodiment, the region 11 is a closed end via that protrudes into the first surface 12.

In this embodiment, the light of multiple wavelengths illuminating the surface 12 is indicated with the arrow 24 and the light of multiple wavelengths reflected by the semiconductor wafer 13 is indicated with the plurality of arrows 25, 26 and 27.

As is illustrated in FIG. 2a, light is reflected from each interface of the semiconductor wafer 13. In this embodiment, light 25 is reflected from the interface between the first surface 12 and the environment, light 26 is reflected from the interface formed between the base 28 of the via 11 and the environment and light 27 is reflected from the interface formed between the second surface 29 of the semiconductor wafer 13 and the environment.

Figure 2B:
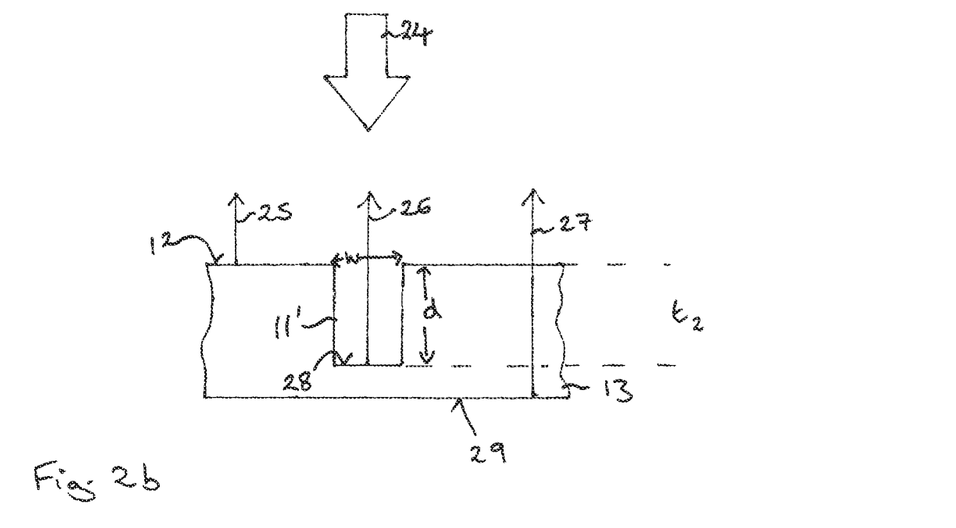

FIG. 2b illustrates a further embodiment in which the via 11' has a higher aspect ratio than that of FIG. 2a and is, therefore, deeper.

In this context, a high aspect ratio is used to determine the ratio of the width indicated with the reference number w to the depth indicated with the reference number d of the region 11. A high aspect ratio is defined here in as a ratio of the width to the depth of at least 1 to 10.

Figure 3:
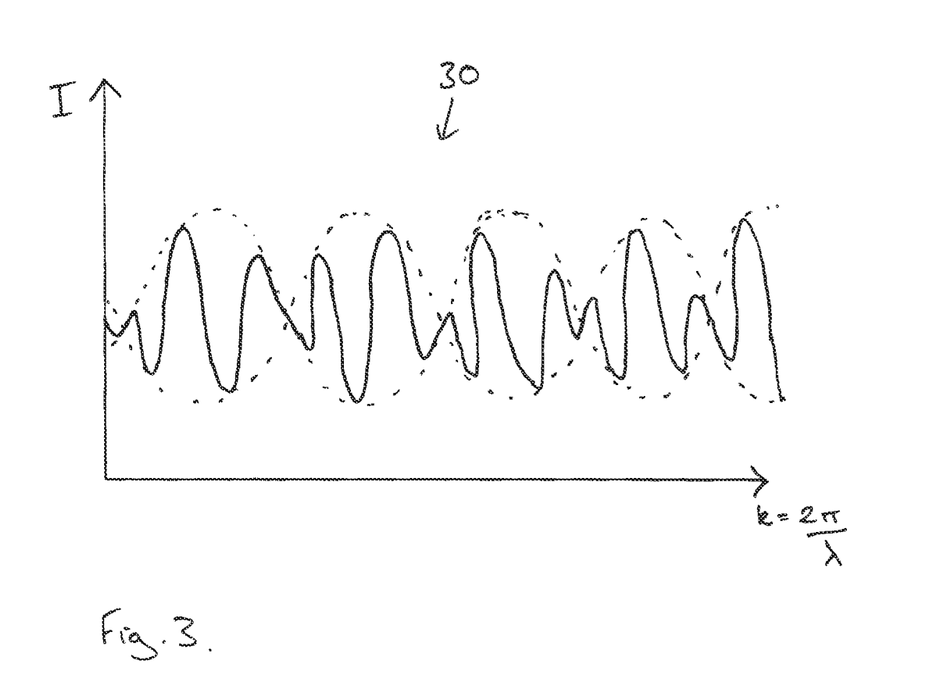
FIG. 3 illustrates an interference pattern produced by the light of multiple wavelengths reflected from the semiconductor wafer.

The light schematically illustrated in FIGS. 2a and 2b with the arrows 25, 26 and 27 reflected from the different interfaces of the semiconductor wafer 13 comprises multiple wavelengths and forms an interference pattern 30 which is schematically illustrated in FIG. 3. This interference pattern 30 is represented as a graph of intensity against a k which is equal to $2\pi$ divided by the wavelength. The interference pattern is of a sinus form with a constant period as indicated in FIG. 3 with a dotted line.

The analysis means 21 is used to analyse the interference pattern 30 that is measured by the spectrometer 16. The analysis means 21 applies a Fourier transform to the interference pattern to produce a graphical representation 31, 31' as illustrated in FIGS. 4a and 4b for the two vias 11, 11' illustrated in FIGS. 2a and 2b, respectively.

In particular, the intensity of the light of multiple wavelengths that is reflected by the semiconductor wafer is measured using a detector having a plurality of pixels. The wavelength of the light collected by each pixel $\lambda(p)$ is determined by the spectrometer 16. The intensity of each wavelength for each pixel is mapped to provide intensity as a function of k where $k=2\pi/\lambda(p)$ with equidistant k using a fast fourier transform to produce a graphical representation of intensity as a function of optical thickness.

Figure 4A:
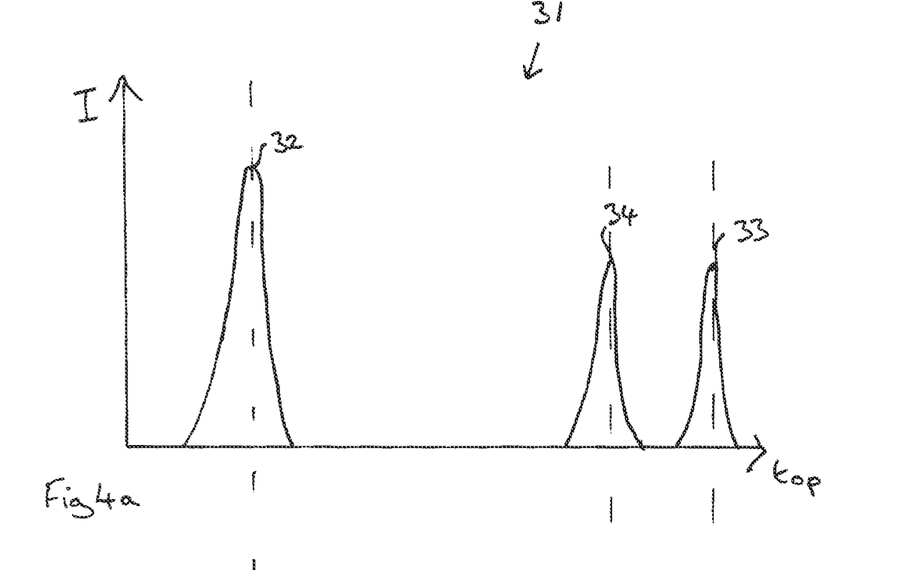
FIGS. 4a and 4b illustrate graphical representations after a Fourier transform has been applied to an interference pattern.
Figure 4B:
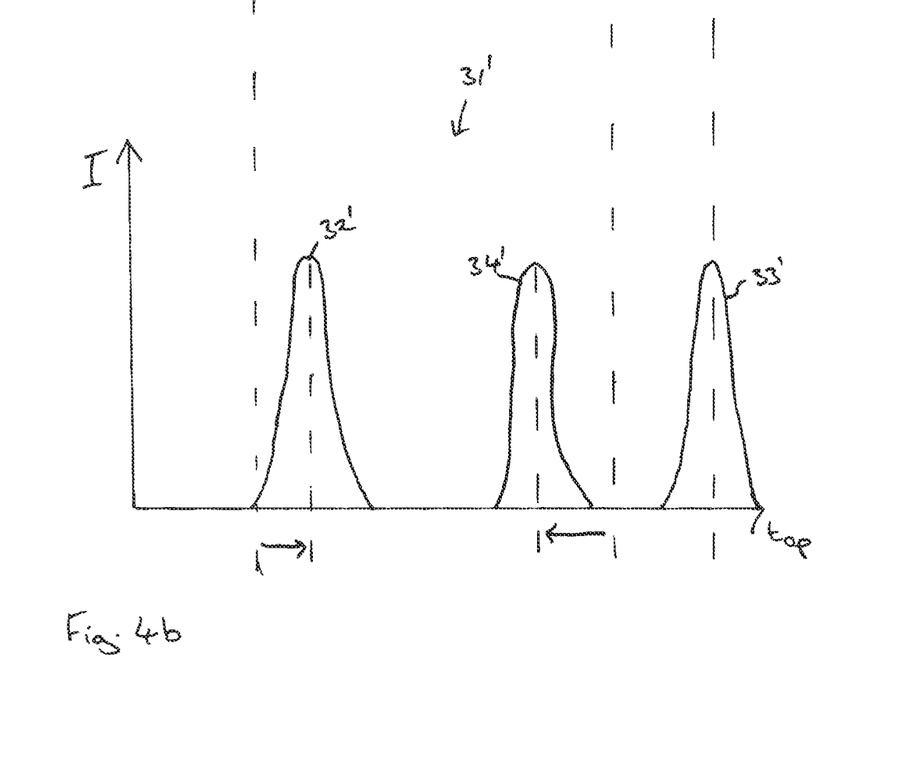

FIGS. 4a and 4b illustrate two examples of a graphical representation 31, 31' in which intensity is plotted against optical thickness. Each of the graphical representations 31, 31' includes three peaks 32, 33, 34, 32', 33', 34' respectively.

In FIG. 4a, the peak 32 having a smaller optical thickness represents the thickness of the optical thickness of the layer formed between the first surface 12 and the base 28 of the via 11. The second peak 33 represents the thickness of the layer formed between the first surface 12 of the semiconductor wafer 13 and the rear surface 29 of the semiconductor wafer 13. The third peak 34 represents the thickness of the layer formed between the base 28 of the via 11 and the rear surface 29 of the semiconductor wafer. The depth d of the via 11 can be determined from the difference between the position of the peaks 33 and 34.

As is illustrated in FIG. 2b, the layer t2 formed between the first surface 12 and the base 28 of the via 11' is larger than the layer t1 of the via 11 illustrated in FIG. 2a.

This is illustrated in FIG. 4b by an increased optical thickness of this layer which results in the first peak 32' being positioned further to the right compared to the peak 32 illustrated in FIG. 4a and also in the peak 34' being positioned further to the left compared to the peak 34 illustrated in FIG. 4a.

The position of the second peak 33' does not change compared with peak 33 as the thickness of semiconductor wafer 13, that is the thickness of the layer formed between the first surface 12 and the second surface 29 of the semiconductor wafer 13, is the same.

The geometrical depth of the vias 11, 11' can be determined from the optical thickness of the layer by dividing the optical thickness by the refractive index of the material forming the layer.

Figure 5:
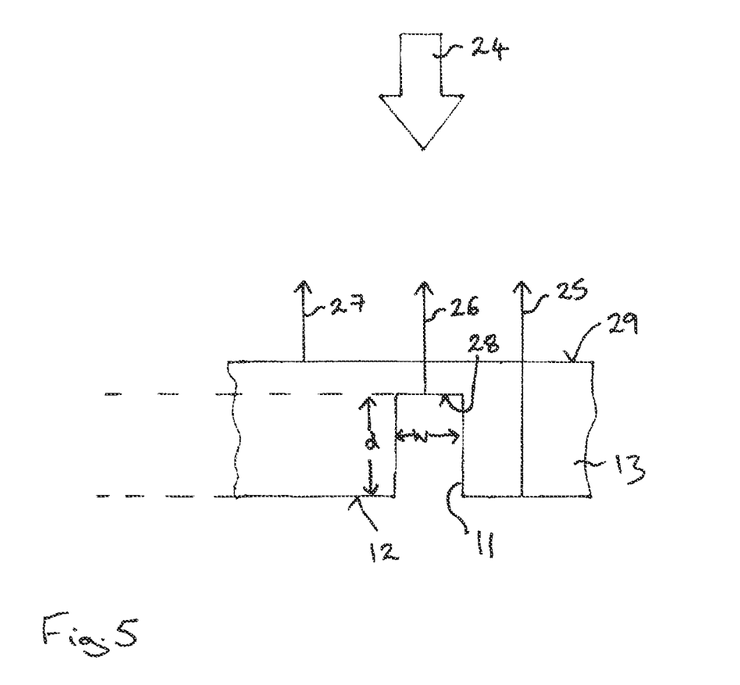
FIG. 5 illustrates measurement of the depth of a region by illuminating the second side of the semiconductor wafer.

FIG. 5 illustrates a further embodiment, in which the light of multiple wavelengths 24 is directed so as to illuminate the second side 29 of the semiconductor wafer 13. The apparatus 10 and methods of analysing the reflected light described above can also be used for this embodiment. The semiconductor wafer 13 may be positioned on the wafer holder 22 illustrated in FIG. 1 so that its second surface 29 faces upwards and the first surface 12 is in contact with the wafer holder 22. Alternatively, the head 15 could be positioned below the wafer holder 22 and the second surface 29 remain, at least in edge regions, in contact with the wafer holder 22.

What is claimed is:

1. A method of measuring the depth of a region having a high aspect ratio that protrudes into a surface of a semiconductor wafer, comprising steps of:
    providing the semiconductor wafer comprising a first major surface, a second major surface opposing the first major surface and a region protruding into the first major surface, the region having a width and a depth and a high aspect ratio,
    illuminating at least one of the first major surface and the second major surface with light comprising multiple wavelengths;
    measuring light of multiple wavelengths that is reflected by the semiconductor wafer as a function of wavelength, the light reflected by the semiconductor wafer forming an interference pattern, wherein the light is emitted from a swept source or the intensity of the light of the multiple wavelengths is determined by a spectrometer, the spectrometer having a detector with a plurality of pixels, each of which is assigned to collect light of a certain predetermined wavelength;
    analysing the measured light by applying a Fourier transform, according to a Fourier domain optical coherence tomography, to the interference pattern and generating a graphical representation having peaks associated with different interfaces of the semiconductor wafer, wherein performed, and
    determining the depth of the region from at least one of the peaks.

2. The method according to claim 1, wherein the intensity of the light of multiple wavelengths that is reflected by the semiconductor wafer is measured as a function of the inverse of the wavelength.

3. The method according to claim 1, wherein the graphical representation comprises intensity as a function of optical depth.

4. The method according to claim 1, wherein an optical depth of the region is determined by the position of the peak in the graphical representation.

5. The method according to claim 1, wherein at least one peak corresponds to an optical thickness of a layer defined by two interfaces.

6. The method according to claim 1, wherein the second major surface of the semiconductor wafer is illuminated with light comprising multiple wavelengths and a geometrical depth of the region is determined by dividing the optical depth of the region by the refractive index of the semiconductor wafer.

7. The method according to claim 1, wherein the measured light is analysed to determine an optical thickness $t_1$ of a layer defined by the interface between the first major surface of the semiconductor wafer and an environment and the interface between a base of the region and the environment.

8. The method according to claim 1, wherein the measured light is analysed to determine an optical thickness $t_2$ of a layer defined by the interface between the second major surface of the semiconductor wafer and an environment and the interface between a base of the region and the environment.

9. The method according to claim 1, wherein the semiconductor wafer is moved relative to the light illuminating the semiconductor wafer and the light reflected by the semiconductor wafer is measured at at least one further position.

10. The method according to claim 9, wherein the semiconductor wafer is moved in two perpendicular dimensions relative to the light illuminating the semiconductor wafer and the reflected light is analysed and a three-dimensional map of the semiconductor wafer is produced.

11. The method according to claim 1, wherein the semiconductor wafer is a silicon wafer and the region is one of the group consisting of a through-hole, a closed end via and a trench.

12. The method according to claim 1, wherein the semiconductor wafer is illuminated with light comprising multiple wavelengths emitted from one of the group consisting of a light emitting diode, a superluminescent diode, a swept source superluminescent diode, an electric or laser-driven Xenon lamp and a super continuum provided by a single fibre source.

13. The method according to claim 1, wherein the light of multiple wavelengths is passed through an optical beam splitter having an input arm, an output arm and a measuring arm before impinging the semiconductor wafer.

14. The method according to claim 1, wherein the light of multiple wavelengths is passed through an input arm and a measuring arm of an optical beam splitter.

15. The method according to claim 1, wherein the reflected light is passed through a measuring arm and an output arm of an optical beam splitter.

16. The method according to claim 1, wherein the reflected light is directed to a spectrometer coupled to an output arm of an optical beam splitter.

17. The method of claim 1, wherein depth of the region is an optical depth.

18. An apparatus for determining a depth of a region having a high aspect ratio that protrudes into a surface of a semiconductor wafer, comprising:
    a multi-wavelength light source;
    a semiconductor wafer holder having a front side for holding the semiconductor wafer;
    a head for directing the light source onto the semiconductor wafer;
    a swept source for emitting light;
    a spectrometer for collecting light comprising multiple wavelengths reflected from the semiconductor wafer, the spectrometer having a detector with a plurality of pixels, each of which is assigned to collect light of a certain predetermined wavelength, and
    an analysis device configured to determine a depth of the region from an interference pattern of light reflected from the semiconductor wafer by performing Fourier domain optical coherence tomography.

19. The apparatus according to claim 18, wherein the head is positioned adjacent the front side of the semiconductor wafer holder.

20. The apparatus according to claim 18, wherein the head is positioned adjacent a side of the semiconductor wafer holder that opposes the front side.

21. The apparatus according to claim 18, further comprising an optical beam splitter comprising an input arm coupled to the light source, an output arm coupled to the spectrometer and a measuring arm coupled to the head.

22. The apparatus according to claim 18, wherein the semiconductor wafer holder is movable in at least one direction perpendicular to the head.

23. The apparatus according to claims 18, wherein the head is movable in a least one direction parallel to the semiconductor wafer holder.

24. The apparatus according to claim 18, wherein the head is movable in a least one direction perpendicular to the semiconductor wafer holder.

25. The apparatus according to claim 18, wherein Fourier domain optical coherence tomography is used to determine the depth of at least one region in a surface of a semiconductor wafer.

26. The apparatus according to claim 18, wherein the Fourier domain optical coherence tomography is used to determine the depth of a closed end via or an open-ended via positioned in a semiconductor wafer.

\* \* \* \* \*